United States Patent [19]

Clift

[11] 4,039,944
[45] Aug. 2, 1977

[54] MOVING COIL ELECTRICAL INSTRUMENT

[75] Inventor: Charles Edward Clift, Montevideo, Minn.

[73] Assignee: Montevideo Technology, Inc., Montevideo, Minn.

[21] Appl. No.: 675,121

[22] Filed: Apr. 8, 1976

[51] Int. Cl.² ............................................. G01R 1/20
[52] U.S. Cl. .................................................. 324/150
[58] Field of Search ................. 324/150, 34 TE, 34 D

[56] References Cited
U.S. PATENT DOCUMENTS

| | | | |
|---|---|---|---|
| 1,697,148 | 1/1929 | Spooner | 324/34 TE |
| 2,109,953 | 3/1938 | Bates | 324/150 |
| 3,181,065 | 4/1965 | Bajars | 324/150 |
| 3,497,806 | 2/1970 | Nador et al. | 324/150 |

Primary Examiner—M. Tokar
Attorney, Agent, or Firm—Dorsey, Windhorst, Hannaford, Whitney & Halladay

[57] ABSTRACT

A moving coil electrical meter mechanism has a substantially rectangular coil and a magnetic structure surrounding first, second and third sides of the coil and defining first, second and third magnetic flux filled air gaps containing magnetic fields so oriented that the forces exerted on the first, second and third sides of the coil are in the same direction. The rectangular coil is mounted to rotate under the influence of the magnetic fields around an axis adjacent to the fourth side of the coil, with the magnetic fields remaining orthogonal to the coil sides during rotation.

12 Claims, 11 Drawing Figures

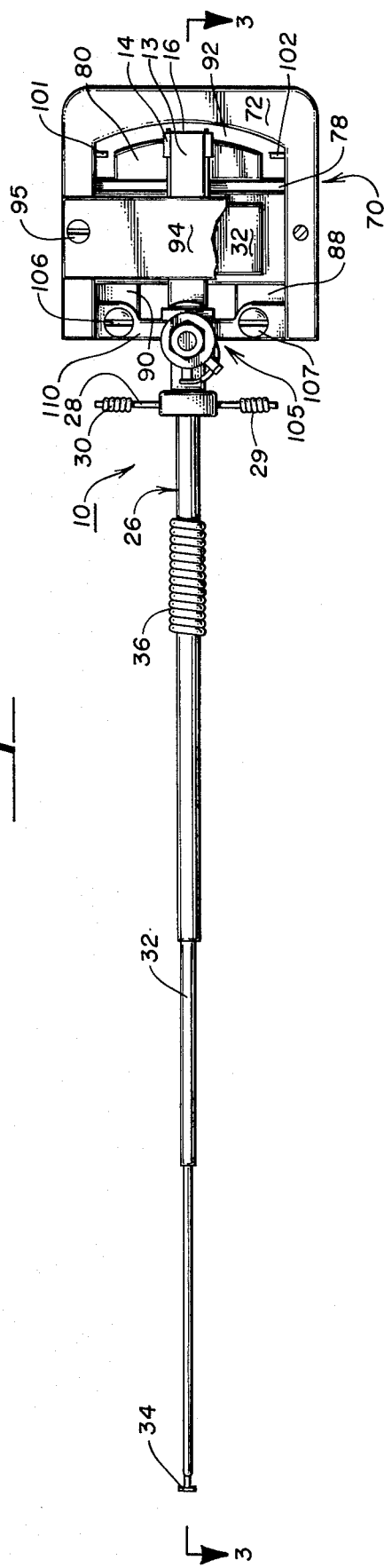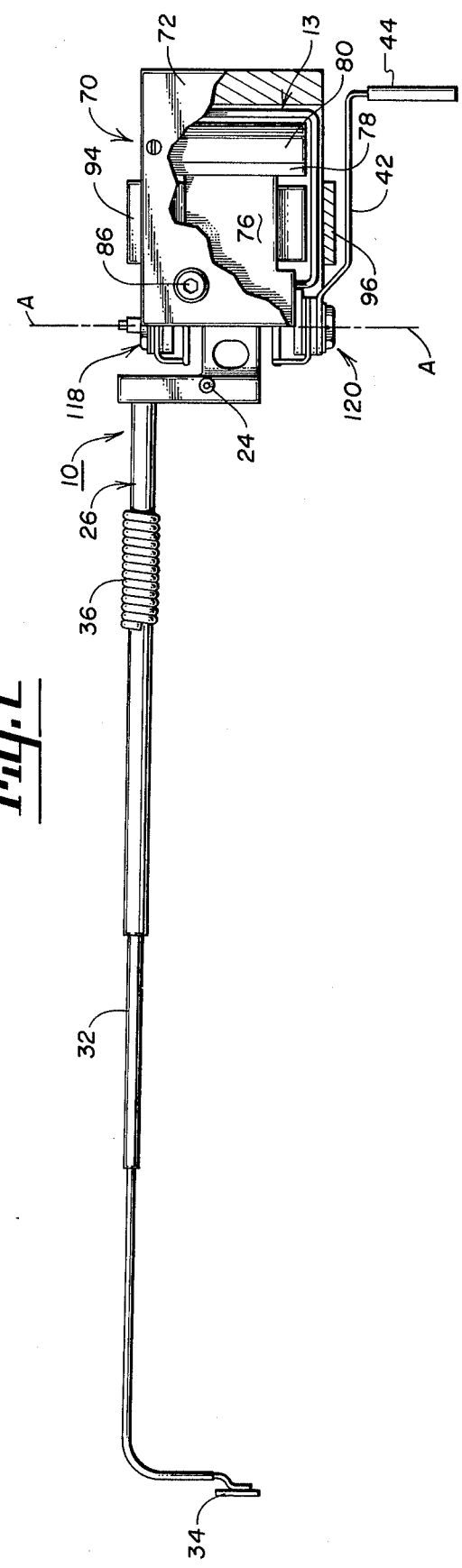

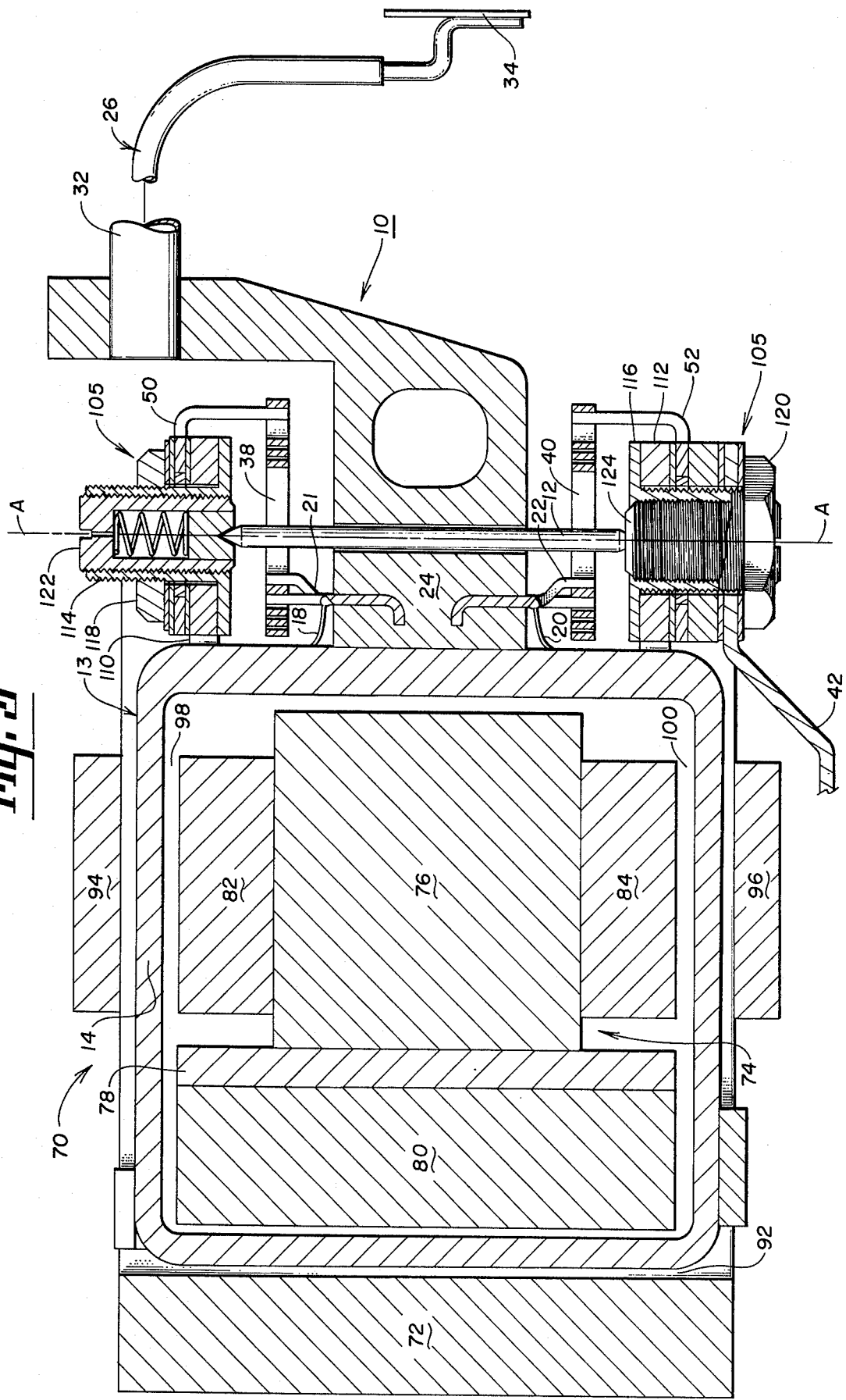

MOVING COIL ELECTRICAL INSTRUMENT

BACKGROUND OF THE INVENTION

1. Field of the Invention

The present invention relates to moving coil electrical instruments, and, more particularly, to a moving coil electrical meter mechanism, utilizing multiple magnetic flux filled air gaps to obtain increased indicator needle torque.

2. Description of the Prior Art

Moving coil meter mechanisms appearing in the prior art are of several basic types. The most common type is the basic D'Arsonval meter which utilizes a square or rectangular meter coil, one side of which is located in a magnetic flux filled air gap. The coil is typically mounted for rotation around an axis located outside the coil. (E.g., Lender, U.S. Pat. No. 3,040,253.) Also found in the prior art are meter mechanisms with square, rectangular or circular coils rotating on an axis corresponding to the axis of symmetry of the coil, with two symmetrical sides of the coil being located in magnetic flux filled air gaps. (E.g., Otzmann, U.S. Pat. No. 2,697,204.) A further type of meter mechanism found in the prior art has a square or rectangular coil mounted for rotation around an axis located outside the coil, with two symmetrical sides of the coil being located in flux-filled air gaps. (E.g., Faria, U.S. Pat. No. 3,490,043.) Still other meter mechanisms using somewhat more complicated configurations of coils and flux-filled air gaps are also known. (E.g., Nakata, U.S. Pat. No. 3,671,862.)

The chief disadvantage of each of these prior art meter mechanisms is the low indicator needle torque generated for a given meter volume. The reason for this disadvantage is that prior meter mechanism designs fail to optimally utilize the metering current flowing in the coil to produce rotational torque for the indicator needle. Typically, the geometry of the magnetic circuits used in prior art meter mechanisms utilizes current on one or, at most, two sides of the meter coil. Also, one or, at most, two magnetic circuits have been used to produce the magnetic flux which interacts with the coil current to provide the rotational torque.

The result of having low indicator needle torque for a given meter volume is that smaller meters, particularly, those suitable for use in aircraft control panels or other environments where space is at a premium, have unsatisfactory accuracy, damping and dynamic characteristics. Thus, with conventional meter mechanism designs there is a crucial trade-off between meter volume and the important performance characteristics of the meter mechanism.

SUMMARY OF THE INVENTION

The present invention is for an improved meter mechanism in which the coil and magnetic circuit configuration provides a high ratio of indicator needle torque to meter volume. According to the present invention, a moving coil electrical meter mechanism comprises: a substantially rectangular coil; a magnetic structure surrounding first, second and third sides of the coil and defining first, second and third magnetic flux filled air gaps wherein the first and third sides of the coil are opposing sides of the rectangle and are located in the first and third air gaps, respectively, said first and third air gaps having therein oppositely directed magnetic fields which are substantially perpendicular to said first and third coil sides, and the second side of the coil, lying between the first and third sides, is located in the second air gap said air gap having therein a magnetic field which is substantially perpendicular to said second coil side and orthogonal to the fields in the first and third air gaps, said magnetic field in said second air gap further having a direction such that the force exerted on the side of the coil located in the second air gap is in the same direction as the forces exerted on the sides of the coil located in the first and third air gaps; means mounting the coil for rotational motion within said magnetic structure about an axis parallel to the second side of the coil; and indicator means responsive to coil movement.

Accordingly, it is an object of the present invention to provide a meter mechanism with a high degree of volumetric efficiency.

Another object of the invention is to provide a meter mechanism with improved accuracy, damping and dynamic characteristics.

A further object of the invention is to provide a meter mechanism with increased indicator needle torque without an increase in input power requirements.

A still further object of the invention is to provide means for reducing the power input requirements of a meter without reducing the available indicator needle torque.

These and other objects of the invention will be apparent from a consideration of the following description and the accompanying drawings and claims.

BRIEF DESCRIPTION OF THE DRAWINGS

FIG. 1 is a top view of the meter mechanism of the present invention.

FIG. 2 is a side view of the meter mechanism.

FIG. 3 is a section view of the meter mechanism taken along line 3—3 of FIG. 1.

As shown in FIGS. 1, 2 and 3, the meter mechanism of the present invention comprises generally an indicator assembly 10 rotatably supported by a bridge assembly 105. The bridge assembly 105 is mounted on a generally box-shaped magnetic circuit structure 70, composed of permanent magnet materials and magnetic flux conductors, which surrounds three sides of a coil or coil subassembly 13 located at one end of the indicator assembly 10. The indicator assembly 10 rotates around an axis A which passes through the bridge assembly 105 and which is vertical, when the meter mechanism is viewed as it is shown in FIG. 2. As best seen in FIGS. 3, 4 and 5, three air gaps 92, 98, 100, corresponding to the three sides of the coil 13 surrounded by the magnetic circuit structure 70, provide clearance for the coil 13 during its rotational movement.

Figure 4:
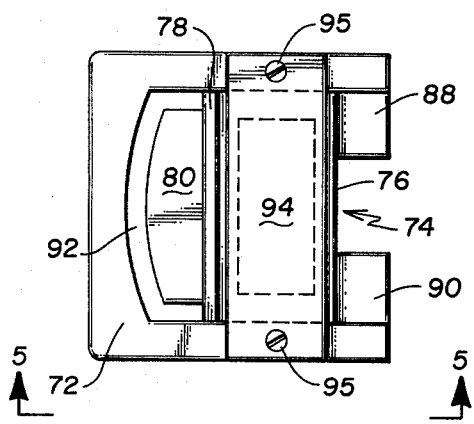
FIG. 4 is a top view of the magnetic circuit structure of the present invention, with the other parts of the mechanism removed.

The coil subassembly 13 of the indicator assembly 10 comprises a coil winding bobbin 14 wound with a suitable number of turns of a thin magnet wire 16 to provide the desired meter input impedance characteristics. In the preferred embodiment this impedance is approximately 1000 ohms. The upper and lower ends 18, 20, respectively, of the coiled magnet wire 16 are soldered to the upper and lower coil terminals 21, 22, respectively, mounted in the coil mounting frame 24. The coil mounting frame 24 supports a pivot axis 12 passing through the frame 24. Attached to the frame 24 is a pointer assembly 26 which comprises a cross arm 28, made of aluminum wire or other suitable material having two small balance weights 29, 30 thereon, and an elongated, stepped indicator needle 32 having a display symbol 34 at its tip and a balance weight 36 near its base. The weights 29, 30, 36 located on the cross arm 28 and the indicator needle 32 are, in the preferred embodiment, short lengths of wire, coiled around their respective supporting members, which can be moved in one direction or the other to provide the desired balance characteristics for the indicator assembly 10.

Referring now to FIG. 3, linking the indicator assembly 10 and the bridge assembly 105 are the upper and lower coiled hairsprings, 38 and 40, respectively, which encircle the pivot axis 12. The inner end of the upper hairspring coil 38 is attached to the upper coil terminal 21 on the coil mounting frame assembly 24. The inner end of the lower hairspring coil 40 is attached to the lower coil terminal 22 on the coil mounting frame assembly 24. The outer ends of the hairspring coils 38, 40 are handled in a corresponding manner. The outer end of the upper hairspring coil 38 is attached to the upper hairspring tab 50 of the bridge assembly 105, while the outer end of the lower hairspring coil 40 is attached to the lower hairspring tab 52 of the bridge assembly 105. The hairspring coils 38, 40 are coiled in opposite directions so that rotational movement of the indicator assembly 10 in one direction causes tighter winding of one coil while the other coil is simultaneously partially uncoiled.

The magnetic circuit structure 70 which surrounds three sides of the coil 13 comprises both permanent magnet materials and magnetically permeable core materials. A generally U-shaped outer core piece 72, preferably made of iron, acts as the basic member on which the magnetic circuit structure 70 is built. The interior of the U-shaped outer core 72 is occupied by a center core assembly 74 comprising a center core piece 76, a pole piece 78, an arcuate end magnet 80 and two small top and bottom slab magnets, 82 and 84, respectively. The center core piece 76, which is preferably made of iron and is roughly C-shaped when viewed from above (as in FIG. 4) is attached to the outer core piece 72 by screws 86 (only one of which is visible in FIG. 2) extending through the outer core piece 72 into the flanges 88, 90 (FIG. 4), of the center core piece 76, which fit closely against the tips of the U-shaped outer core piece 72. At the surface of the center core piece 76 which faces the inner curved portion of the U-shaped outer core piece 72 is fastened, by any suitable means, the pole piece 78, a rectangular slab of a magnetically permeable material, such as Armco Elec-Iron or its equivalent. Thus, one surface of the pole piece 78 butts up against the center core piece 76. At the other surface of the pole piece 78 the end magnet 80, a permanent magnet, made, preferably, of strontium ferrite and having one flat surface and a second arcuate surface, is attached. The arcuate surface of the end magnet 80 is congruent with the arcuate shape of the outer core piece 72, and in spaced relation therewith, thereby defining an arcuate end air gap 92 of substantially uniform width. The curvature of the arcuate surfaces of the end magnet 80 and the inner portion of the outer core piece 72 is such that the end air gap 92 has the form of a cylinder section, having as its central axis the axis of rotation A and as its radius, the distance from the axis of rotation A to the side of the coil located in the end air gap 92.

Figure 5:
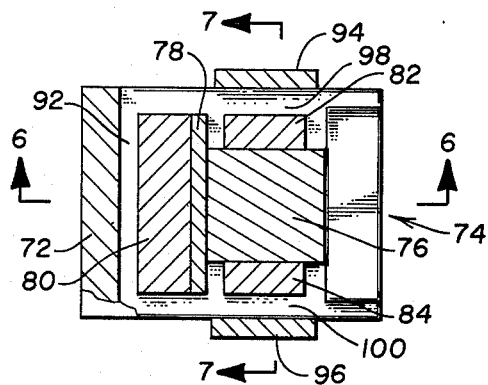
FIG. 5 is a cutaway view taken along line 5—5 of FIG. 4.

Referring now to FIGS. 3, 4 and 5, attached to the top and bottom surfaces of the center pole piece 76 are top and bottom magnets 82, 84, respectively, which are made of a material offering particularly high magnetic field density with a short pole-to-pole dimension. In the preferred embodiment samarium cobalt magnets are used. Attached, by means of screws 95, to the top and bottom of the legs of the U-shaped outer core 72 are rectangular return path plates 94, 96, slabs of magnetically permeable material which form, by their spaced relation with respect to the top and bottom magnets 82, 84, planar top and bottom air gaps 98, 100 respectively.

Figure 7:
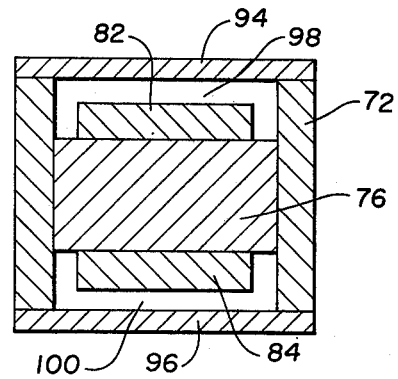
FIG. 7 is a section view taken along line 7—7 of FIG. 5.
Figure 8:
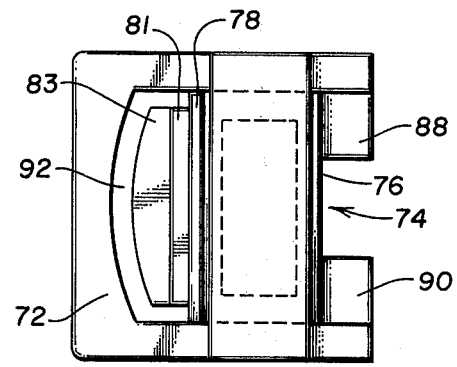
FIG. 8 is a top view of an alternate embodiment of the magnetic circuit structure.

In an alternate embodiment of the magnetic circuit structure 70 shown in FIG. 8, the arcuate end magnet 80 is replaced by a combination of a substantially flat permanent magnet 81 and a second pole piece 83, with one flat surface attached to and butting against the magnet 81 and an arcuate surface, shaped like that of the end magnet 80 shown in FIG. 4, facing the end air gap 92. In this embodiment the magnet 81 is, preferably, a samarium cobalt magnet of the same type as is used for the top and bottom magnets 94, 96. The second pole piece 83 is made, preferably, of Armco Elec-Iron or the equivalent. This alternate embodiment is in all other respects the same as that shown in FIGS. 1–7.

Referring now again to FIG. 3, since the forces exerted on the coil sides located in each of the three air gaps 92, 98, 100 must result in torques having an additive relationship, the orientation of the poles of each of the magnets 80, 82, 84 is significant. In order for the forces on the three sides of the coil located in the air gaps 92, 98, 100 to be in the same direction, each of the magnets 80, 82, 84 must have the same pole facing its associated air gap. That is, each magnet must have its south pole facing its respective air gap and its north pole butting against the center core piece 76, or vice versa. While in the preferred embodiment all south poles face the air gaps 92, 98, 100, either arrangement could be used. The only difference between the two arrangements being in the direction of deflection of the indicator needle for a given direction of current.

Figure 6:
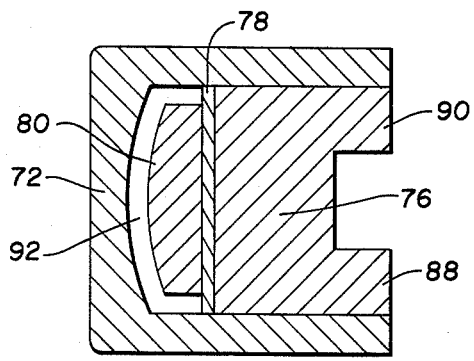
FIG. 6 is a section view taken along line 6—6 of FIG. 5.
Figure 9:
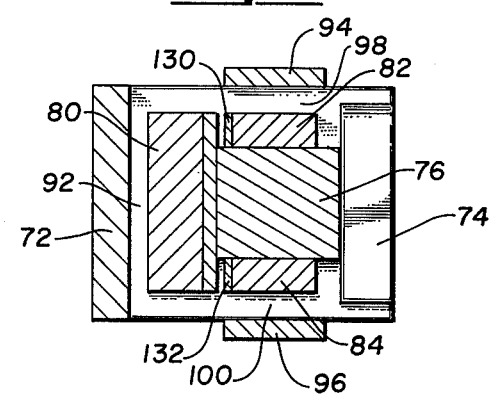
FIG. 9 is a cutaway view, as in FIG. 5, of an alternate embodiment of the magnetic circuit structure showing use of magnetic shunts.

The magnetic circuit structure 70 of the preferred embodiment results in three essentially independent magnetic circuits. As illustrated in FIG. 6, the magnetic circuit of the end magnet 80 begins at the south pole of the end magnet 80, crosses the end air gaps 92 to enter the outer core piece 72, divides to follow both sides of the outer core piece 72 back to the center core piece 76, passes through the center core piece 76 to enter pole piece 78, and, focused by pole piece 78, returns to the north pole of the end magnet 80. As illustrated in FIG. 7, the magnetic circuits of top and bottom magnets 82, 84 are symmetrical. The circuit for the top magnet 82 begins at the south pole of the top magnet 82, crosses the air gap 98 to reach the top return path plate 94, divides to follow the return path plate 94 and the two sides of the outer core piece 72 back to the center core piece 76 and returns to the north pole of the top magnet 82. The magnetic circuit for the bottom magnet 84 makes use of the bottom return path plate 96, but is otherwise identical.

Although the preferred embodiment described herein shows three separate permanent magnets 80, 82, 84, it is clear that three magnetic flux filled air gaps having the proper field directions could also be obtained by use of a single magnet with an appropriate configuration of magnetic conductors leading from the single magnet to form three air gaps. Similarly, a pair of magnets used with appropriate magnetic conductors could be used to form three air gaps. However, because of the losses in magnetic field strength which would occur with longer field paths, the three magnet embodiment described herein is preferred.

Referring now again to FIGS. 1, 2 and 3, the bridge assembly 105 in which the pivot axis 12 of the indicator assembly is rotatably mounted is affixed to the center core piece 76. The top bridge piece 110 is attached to the flanges 88, 90 of the center core piece 76 by two screws 106, 107, which enter the flanges 88, 90. The bottom bridge piece 112 is similarly attached by two screws (not shown). Jewel screw retainers 114, 116 are attached by lock-nut and insulating washer assemblies 118, 120 to the center of each bridge piece 110, 112. Spring-loaded jewel screws 122, 124 inserted in the jewel screw retainers 114, 116 receive the ends of the pivot axis 12, so that the entire indicator assembly 10 is rotatably mounted and protected against vibration. The hairspring tabs 50, 52 which are held in place by the lock-nut assemblies 118, 120 are connected by soldered bonds to the outer ends of the coil hairsprings 38, 40.

Connected to the lower portion of the bridge assembly 105 is the zero-adjust tab 42, an approximately L-shaped member with an insulating sleeve 44 (FIG. 2) at one end. The other end of the zero-adjust tab 42 is mounted in the lower lock-nut and insulating washer assembly 120. Due to the compression exerted by the lock-nuts and the resulting high frictional forces between the sandwiched members of the lock-nut assembly, there is a mechanical linkage between the zero-adjust tab 42 and the hairspring tab 52 to which the outer end of coil hairspring 40 is attached. Accordingly, rotational movement of the zero-adjust tab 42 is transmitted to the outer end of coil hairspring 40. Thus, by loosening or tightening the coiling of coil hairspring 40 through the zero-adjust tab 42, the balance of spring forces on the indicator assembly 10 can be adjusted to produce the desired zero-point.

Referring now again to FIG. 1, at either side of the arcuate end air gap 92 are small pins 101, 102, made of ceramic or other suitable porous material, which serve as stationary stops limiting the angular rotation of the indicator assembly 10. These pins 101, 102 are located so that they mate with two small moving stops (not shown) mounted on the edges of the coil bobbin 14. The moving stops are also made of ceramic or other suitable porous material. The presence of the pins 101, 102 and the moving stops helps prevent the meter mechanism from sticking or hanging up at either extreme of rotation. Contaminants which may tend to collect on pins 101, 102 are absorbed by the ceramic material and therefore accumulate into potential sticky deposits more slowly. To facilitate periodic cleaning of the pins 101, 102, they may be mounted in small threaded receptacles (not shown) which are screwed into the inner wall of outer core piece 72. This type of screw mounting also allows easy adjustment of the angular range of meter deflection since the screws may be extended into the end air gap 92 or retracted.

In an alternative embodiment of the meter mechanism shown, in part, in FIG. 8, the magnetic circuit structure 70 is supplied with means for improving the linearity of its response over a wide temperature range. As shown in FIG. 8, magnetic shunts 130, 132 are placed against one end of both the top and the bottom magnets 82, 84. The material from which these shunts 130, 132 are made has a magnetic permeability which varies with temperature. The shunts function by diverting from the air gaps 98, 100 small amounts of magnetic field strength, the amount diverted varying as a function of temperature. The variations in field strength caused by the shunts compensates for other temperature non-linearities in the meter mechanism, such as changes in the flux density produced by the magnets 80, 82, 84 or in hairspring coil spring constant. By choosing shunts of appropriate size, shape and permeability, a meter mechanism is obtained in which substantially the same total rotational deflection will occur for a given amount of input current, at any temperature. While FIG. 8 shows shunts at one end of the top and bottom magnets 82, 84 it is clear that the same compensating effects are produced by shunts at the other end or at both ends of the magnet or by having only one magnet shunted.

Figure 11:
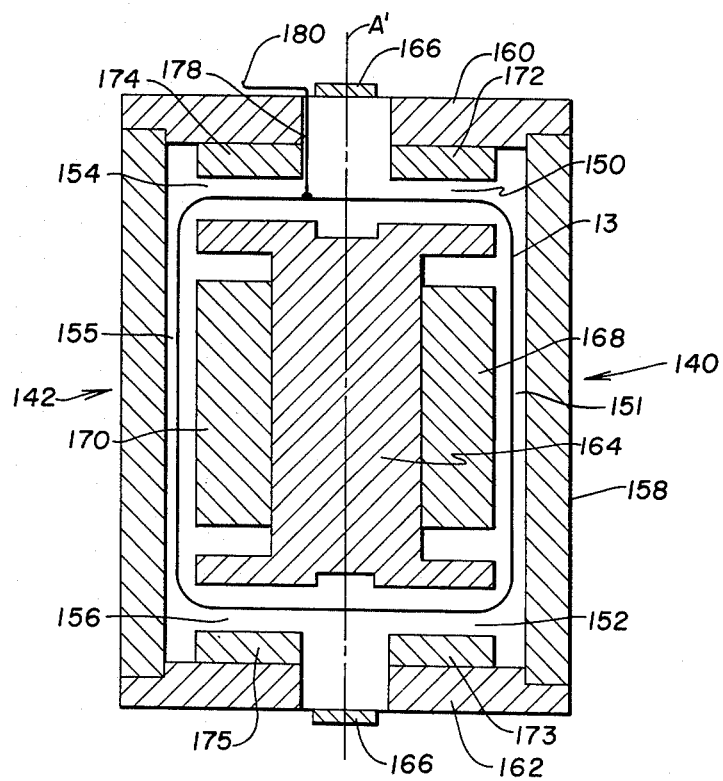
FIG. 11 is a section view taken along line 11—11 of FIG. 10.
Figure 10:
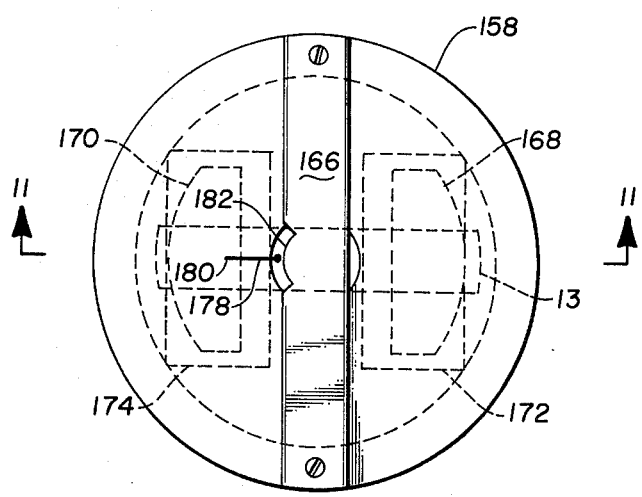
FIG. 10 is a top view of an alternate embodiment of the present invention which illustrates two magnetic structures of the type shown in FIGS. 1-8.

Still another embodiment of the present invention is shown in FIGS. 10 and 11, where a meter mechanism combining two magnetic structures of the type shown in FIGS. 1-8 is depicted. Referring now to FIG. 11, the coil 13 is mounted for rotation around an axis A' which is perpendicular to one pair of coil sides and passes through the interior of the coil 13 dividing it into a first portion and second portion. The first and second magnetic structures 140, 142, respectively, located on either side of the axis A' and surrounding the first and second portions of the coil have essentially the same air gap and magnetic field configuration as the single magnetic structure in the meter mechanism shown in FIGS. 1-8. In the embodiment of FIGS. 10 and 11, however, each magnetic structure surrounds only a portion of the rectangular coil 13. The magnetic structure 140, located on one side of the axis A', defines first, second, and third air gaps 150, 151, 152, respectively, while the second magnetic structure 142, located on the other side of the axis A', defines fourth, fifth and sixth air gaps 154, 155, 156, respectively. Located in the first and third air gaps 150, 152 are segments of each of the two coil sides oriented perpendicular to the axis A'. Similarly, located in the fourth and sixth air gaps 154, 156 are the remaining segments of each of the two coil sides lying perpendicular to the axis A'. Located in the second and fifth air gaps 151, 155 are the two sides of the coil 13 which are oriented parallel to the axis A'. Accordingly, each magnetic structure derives torque from one full side of the rectangular coil 13 and from segments of two sides of the coil 13. In the preferred embodiment shown in FIGS. 10 and 11, the axis A' passes through the center of the coil 13 and the segments are approximately half of a coil side. The following discussion is directed to this symmetrical embodiment.

The magnetic fields in the two magnetic structures 140, 142, are oriented so that the rotational torque produced by the fields in all six air gaps is in the same direction. To accomplish this, the fields in the first and third air gaps 150, 152, are in a direction opposite to that of the fields in the symmetrically located fourth and sixth air gaps 154, 156. On the other hand, the field in the second air gap 151 is in the same direction as the field in the fifth air gap 155. These field directions are obtained when the first magnetic structure 140, and the second magnetic structure 142 are symmetrically constructed except that the poles of corresponding permanent magnets are reversed.

The magnetic circuits of the embodiment shown in FIGS. 10 and 11 are sustained by a magnetic core structure having a cylindrical return path and outer rame 158, preferably made of iron, and circular upper and lower end caps 160, 162, respectively, which serve as return paths aiding the air gaps 150, 152, 154, 156. The center core piece 164, also preferably of iron, and resembling, in the view shown in FIG. 11, a broad H turned on its side, has the two center magnets 168, 170, attached to opposing sides. The four top and bottom magnets 172, 173, 174, 175 which provide the magnetic flux for the first, third, fourth, and sixth air gaps 150, 152, 154, 156, are attached to the top and bottom end caps 160, 162. The coil 13 which encircles the center core piece 164 is rotatably mounted in a manner similar to that shown in the embodiment represented in FIG. 3. A pivot (not shown) passing through the center of the coil 13 is received by jewel bearing assemblies (also not shown) mounted on upper and lower bridges 166. A coiled hairspring assembly (not shown), also similar to that used in the embodiment shown in FIG. 3, provides the spring forces for the meter mechanism.

The indicator arm 178 is a thin projection of suitable material which is fastened to the top of the coil 13 and extends outward through the top end cap 160. An indicator symbol 180 is mounted at the end of the indicator arm 178. Movement of the indicator arm 178 is accommodated for by a notch 182 of suitable shape cut into the upper bridge 166.

The operation of the embodiment shown in FIGS. 10 and 11 is, in principle, the same as that of the embodiment of the meter mechanism shown in FIGS. 1–8, except that the two magnetic structures 140, 142 develop their complementary torques in tandem. The result is a sort of "push-pull" meter mechanism in which a high percentage of the available coil length is utilized.

While the embodiments of the meter mechanism shown herein are described as having "air" gaps, it is clear that the meter mechanism of the present invention would have advantages over the prior art in other working media. Accordingly, the present invention is not limited to air gaps, literally understood, but may be used in a vacuum or in any gas or liquid medium having suitable magnetic permeability.

The operation of the above-described meter mechanism can be described as follows. Current to be metered is introduced by applying a voltage at the hairspring tabs 50, 52. The input current flows through one hairspring, thru the wire windings 16 of the coil 13 and out through the other hairspring. When no current is flowing, there are no electromotive forces exerted on the coil 13, and the indicator needle 32 will rest at some zero point determined by the balanced spring forces of the coiled hairsprings 38, 40. When, however, a current flows through the coil 13 the interaction of this current with the magnetic fields present in the air gaps 92, 98, 100 produces forces, according to well known laws of electromagnetism, which are exerted on each winding in the coil 13. The geometry of the coil 13 and the magnetic circuit structure 70 are chosen so that the force exerted on each one of the three coil sides complements the forces exerted on the other two coil sides, to produce a net rotational torque around the axis A. Current flowing through the coil 13 will, depending on its polarity, rotate the indicator assembly 10 around the axis A in the direction corresponding to the sum of the torques produced. As the indicator assembly 10 rotates, one hairspring is coiled more tightly while the other becomes less tightly coiled. The natural tendency of both springs is, accordingly, to oppose the electromotive rotational forces. When the current to be measured is constant, the spring forces and the electromotive forces come into balance, and the indicator assembly 10 comes to rest after being rotated a certain number of degrees from its zero, or no input current position. When the input current changes, the electromotive forces change and a new rest position is found. Displacement of the display symbol 34 along a scale (not shown) indicates the strength and polarity of the input signal.

although specific embodiments of the present invention have been shown, those skilled in the art will preceive further modifications, other than those specifically discussed, which can be made without departing from the spirit of the invention, and it is intended by the appended claims to cover all such modifications as fall within the true spirit and scope of the invention.

What is claimed as new and desired to be secured by letters patent of the United States is:

1. A moving coil electrical meter mechanism which comprises:

a substantially rectangular coil;

a magnetic structure surrounding first, second, and third sides of the coil and defining first, second, and third magnetic flux filled air gaps wherein the first and third sides of the coil are opposing sides of the rectangle and are located in the first and third air gaps, respectively, said first and third air gaps having therein oppositely-directed magnetic fields which are substantially perpendicular to said first and third coil sides, and the second side of the coil, lying between the first and third sides, is located in the second air gap, said air gap having therein a magnetic field which is substantially perpendicular to said second coil side and orthogonal to the fields in the first and third air gaps, said magnetic field in said second air gap further having a direction such that the force exerted on the side of the coil located in the second air gap is in the same direction as the forces exerted on the sides of the coil located in the first and third air gaps, said magnetic structure comprising first, second, and third permanent magnets each having a different orientation, and a core assembly of magnetically permeable materials magnetically connected to said first, second, and third permanent magnets to form first, second, and third magnetic circuits, said first, second, and third magnetic circuits providing magnetic flux for the first, second, and third air gaps, respectively;

means mounting the coil for rotational motion within said magnetic structure about an axis parallel to the second side of the coil; and indicator means responsive to coil movement.

2. The moving coil electrical meter mechanism recited in claim 1 wherein:

the first and third air gaps defined by the magnetic structure are essentially planar, the planes of said first and third air gaps being perpendicular to the axis of the coil; and the second air gap defined by the magnetic structure is in the form of a cylinder section having as its central axis the axis of rotation of the coil and as its radius, the distance from the axis of rotation to the second side of the coil.

3. The moving coil electrical meter mechanism recited in claim 2 wherein the first, second, and third permanent magnets have one pole surface located immediately adjacent the first, second, and third air gaps, respectively.

4. The moving coil electrical meter mechanism recited in claim 2 wherein at least one of the first, second, and third magnets has a pole piece interposed between the pole surface of the magnet and its corresponding air gap.

5. The moving coil electrical meter mechanism recited in claim 2 wherein at least one of the first, second, and third permanent magnets is made of a material having a high magnetic field density with a short pole-to-pole dimension.

6. The moving coil electrical meter mechanism recited in claim 2 wherein at least one of the three permanent magnets is made of samarium cobalt.

7. The moving coil electrical meter mechanism recited in claim 1 wherein the magnetic structure surrounding the first, second, and third sides of the coil comprises:

a center core piece of magnetically permeable material having substantially the shape of a rectangular solid, said center core piece being located so that it is encircled by the coil, said center core piece further having first, second, and third surfaces in proximity to and oriented parallel to the first, second, and third sides of the coil, respectively;

first, second and third permanent magnets attached to the first, second, and third sides of the center core piece, said permanent magnets each having like poles of one magnetic sense facing the surfaces of the center core piece to which they are attached, and like poles of the other magnetic sense facing the first, second, and third sides of the coil, respectively;

a U-shaped outer core piece of magnetically permeable material surrounding the coil and the center core piece, wherein the inner curved portion of the U shape faces the second side of the coil and is in spaced relation with the second permanent magnet, thereby forming the second air gap, and the legs of the U shape are attached to the two surfaces of the center core piece which are parallel to the plane of the coil; and first and second return path pieces of magnetically permeable material connected to and spanning between the legs of the U-shaped outer core piece, said return path pieces being oriented substantially parallel to the first and third sides of the center core piece, respectively, and being in spaced relationship with the first and third permanent magnets thereby forming the first and third air gaps.

8. The moving coil electrical meter mechanism recited in claim 7 wherein at least one of the three permanent magnets is made of samarium cobalt.

9. The moving coil electrical meter mechanism recited in claim 7 further comprising temperature responsive means for shunting magnetic flux originating from at least one of said first, second, and third permanent magnets away from its corresponding air gap, said temperature responsive means comprising a shunt formed of a material having a magnetic permeability which varies as a function of temperature of the mechanism, said shunt being interposed at an edge of at least one of said permanent magnets.

10. A moving coil electrical meter mechanism which comprises:

a substantially rectangular coil;

means mounting said coil for rotational motion about an axis perpendicular to one pair of sides of the coil and passing through the interior of the coil, said axis dividing said coil into a first portion and a second portion;

a first magnetic structure surrounding the first portion of the coil, said magnetic structure defining first, second, and third magnetic flux filled air gaps wherein first and third opposing coil segments, perpendicular to the axis of rotation and surrounded by the first magnetic structure, are located in the first and third air gaps, respectively, said air gaps having therein oppositely-directed magnetic fields substantially perpendicular to their respective coil segments, and a first full side of the coil, lying between the first and third coil segments, is located in the second air gap, said air gap having therein a magnetic field which is substantially perpendicular to the first full side of the coil and orthogonal to the fields in the first and third air gaps, said magnetic field in said second air gap further having a direction such that the force exerted on the first full side of the coil is in the same direction as the forces exerted on the first and third coil segments by the fields in the first and third air gaps; and indicator means responsive to coil movement.

11. The moving coil electrical meter mechanism recited in claim 10, further comprising:

a second magnetic structure surrounding the second portion of the coil, said second magnetic structure defining fourth, fifth, and sixth magnetic flux filled air gaps wherein fourth and sixth opposing coil segments, perpendicular to the axis of rotation and surrounded by the second magnetic structure, are located in the fourth and sixth magnetic flux filled air gaps, respectively, said air gaps having therein oppositely-directed magnetic fields substantially perpendicular to their respective coil segments, said oppositely-directed fields further having a direction such that the forces exerted on the fourth and sixth coil segments are in a direction opposite to the forces exerted on the first and third coil segments, and a second full side of the coil, lying between the fourth and sixth coil segments, is located in the fifth air gap, said air gap having therein a magnetic field which is substantially perpendicular to the second full side of the coil and orthogonal to the fields in the fourth and sixth air gaps, said magnetic field in said fifth air gap further having a direction such that the force exerted on the second full side of the coil is in a direction opposite to that of the force exerted on the first full coil side.

12. The moving coil electrical meter mechanism recited in claim 11, wherein at least one of said first and second magnetic structures comprises:

first, second and third permanent magnets each having a different orientation; and a core assembly of magnetically permeable materials magnetically connected to said first, second and third permanent magnets to form first, second and third magnetic circuits, said first, second and third magnetic circuits providing magnetic flux for the respective air gaps associated with the particular magnetic structure so comprised.

* * * * *

UNITED STATES PATENT OFFICE
CERTIFICATE OF CORRECTION

PATENT NO. : 4,039,944

DATED : August 2, 1977

INVENTOR(S) : Charles E. Clift

It is certified that error appears in the above-identified patent and that said Letters Patent are hereby corrected as shown below:

Column 2, line 51, "illustrates" should be --utilizes--

Column 7, line 11, "rame" should be --frame--

Column 9, line 4, "axis of the coil;" should be --axis of rotation of the coil;--

Signed and Sealed this

Twenty-second Day of November 1977

[SEAL]

Attest:

RUTH C. MASON
Attesting Officer

LUTRELLE F. PARKER
Acting Commissioner of Patents and Trademarks